United States Patent
Gautam et al.

(10) Patent No.: US 9,916,903 B2
(45) Date of Patent: Mar. 13, 2018

(54) OTPROM FOR POST-PROCESS PROGRAMMING USING SELECTIVE BREAKDOWN

(71) Applicant: GlobalFoundries Inc., Grand Cayman (KY)

(72) Inventors: Akhilesh Gautam, Malta, NY (US); Suresh Uppal, Clifton Park, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 113 days.

(21) Appl. No.: 14/514,289

(22) Filed: Oct. 14, 2014

(65) Prior Publication Data

US 2016/0104541 A1 Apr. 14, 2016

(51) Int. Cl.
G11C 17/12 (2006.01)
H01L 27/112 (2006.01)
G11C 17/18 (2006.01)

(52) U.S. Cl.
CPC ............ *G11C 17/12* (2013.01); *G11C 17/18* (2013.01); *H01L 27/11233* (2013.01)

(58) Field of Classification Search
CPC ......... H01L 2924/00; H01L 2924/1305; H01L 2924/13091; H01L 2924/0002; H01L 2924/13; H01L 27/11233; G11C 17/12; G11C 17/18
USPC .............................. 257/208, 43; 365/104, 96
See application file for complete search history.

(56) References Cited

U.S. PATENT DOCUMENTS

| | | | | |
|---|---|---|---|---|
| 6,249,472 B1* | 6/2001 | Tamura | ................... | G11C 17/18 257/530 |
| 7,723,820 B2* | 5/2010 | Kim | ..................... | H01L 23/5252 257/528 |
| 9,076,526 B2* | 7/2015 | Chung | .................... | G11C 15/04 |
| 9,496,265 B2* | 11/2016 | Chung | .................. | H01L 27/101 |
| 2006/0193163 A1* | 8/2006 | Ito | .......................... | G11C 5/145 365/149 |
| 2008/0048169 A1* | 2/2008 | Doyle | ................ | G11C 13/0004 257/4 |
| 2009/0045484 A1* | 2/2009 | Chanda | ............... | H01L 23/5256 257/529 |
| 2009/0285041 A1* | 11/2009 | Ito | .......................... | G11C 5/145 365/189.16 |
| 2010/0115475 A1* | 5/2010 | Buonpane | ........... | G06F 17/5063 716/132 |
| 2010/0182818 A1* | 7/2010 | Ito | .......................... | G11C 17/16 365/96 |

OTHER PUBLICATIONS

Ito et al., Pure CMOS One-time Programmable Memory using Gate-Ox Anti-fuse, 2004 IEEE, 20-4-1:4, pp. 469-472.*

* cited by examiner

*Primary Examiner* — Vu Le
*Assistant Examiner* — Sung Cho
(74) *Attorney, Agent, or Firm* — Williams Morgan, P.C.

(57) ABSTRACT

At least one method, apparatus and system disclosed involves hard-coding data into an integrated circuit device. An integrated circuit device provided. Data for hard-wiring information into a portion of the integrated circuit device is received. A stress voltage signal is provided to a portion of a transistor of the integrated circuit device for causing a dielectric breakdown of the portion of the transistor for hard-wiring the data.

12 Claims, 8 Drawing Sheets

OTPROM FOR POST-PROCESS PROGRAMMING USING SELECTIVE BREAKDOWN

BACKGROUND OF THE INVENTION

1. Field of the Invention

Generally, the present disclosure relates to the manufacture of sophisticated semiconductor devices, and, more specifically, to various methods and structures for a novel one-time-only programmable read-only memory (OTPROM) that provides for post-process programming using selective breakdown of dielectric.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

In this manner, integrated circuit chips may be fabricated. In some cases, integrated circuit or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

Turning now to FIG. 1, a flowchart depiction of a prior art process of hard-code programming of an integrated circuit device is illustrated. An integrated circuit device is fabricated up to a layer below the programming layer (block 110). The programming layer includes transistors that are configured to hold bits of data for hard-coding or hard-wiring a program code. At this point, processing of the integrated circuit is suspended until the program code for performing the hard-coding is received (block 120). Frequently, a semiconductor device manufacturer has to suspend processing operations until a customer or a third party provides the program code. This protocol may cause delays in the processing operation. Often, process operations are significantly delayed at timeline 125, wherein process operations are paused until program code for hard-coding a program into the integrated circuit device is received.

Once the program code is received, which is in the form of binary data, it is hard-coded in the programming layer (block 130). Subsequently, the manufacturing process is continued for fabricating the remaining layers over the programming layers (block 140). Upon completion, the tape-out results are provided (block 150).

One problem associated with the prior art includes a delay in time-to-market cause by the pause when waiting for the program code. The processing of the integrated circuit device is interrupted by this pause. In some cases, completing processing of the device may take months due to this interruption.

Moreover, using state of the art methodology, different fabrication processes have to be performed for different customers of the integrated circuit device. This separation is required because of the programming step, which is an intervening step during the overall fabrication process of the integrated circuit device. That is, similar fabrication processes are performed separately for different customers because each customer may provide a different program code for hardwire programming. This may result in further inefficiencies. Further, since different customers or third parties provide program code at different times, uniformity in process steps may be difficult to attain. This may cause inefficiencies and higher costs in manufacturing semiconductor devices.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for hard-coding data into an integrated circuit device. An integrated circuit device provided. Data for hard-wiring information into a portion of the integrated circuit device is received. A stress voltage signal is provided to a portion of a transistor of the integrated circuit device for causing a dielectric breakdown of the portion of the transistor for hard-wiring the data.

BRIEF DESCRIPTION OF THE DRAWINGS

The disclosure may be understood by reference to the following description taken in conjunction with the accompanying drawings, in which like reference numerals identify like elements, and in which.

Figure 1:
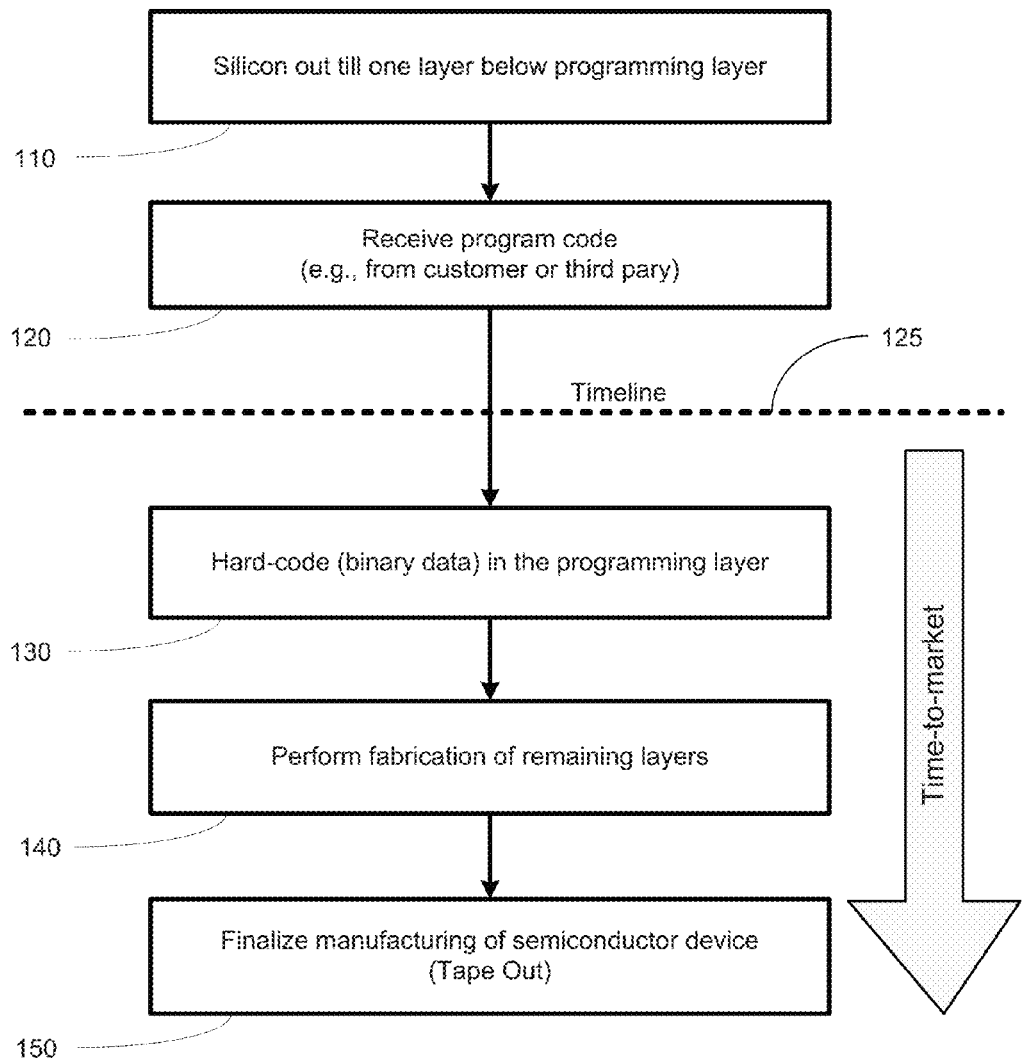
FIG. 1 illustrates flowchart depiction of a prior art process of hard-code programming of an integrated circuit device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing hard-coded programming of an integrated circuit device in a post-processing manner. That is, embodiments herein provide for substantially completing processing of semiconductor devices prior to hard-code or hard-wiring program code into the devices. For example, stress voltages may be used to configure various devices, e.g., transistors, in semiconductor devices in an addressable scheme such that binary data representing a program code may be hard-coded into the programming layer even after the processing of the semiconductor devices is complete. The stress voltages may be used to selectively cause a breakdown of certain portions of the dielectric in discrete devices (e.g., transistors) in a strategic manner so that certain states of the discrete devices after the selective breakdown provide binary data representations.

Figure 2:
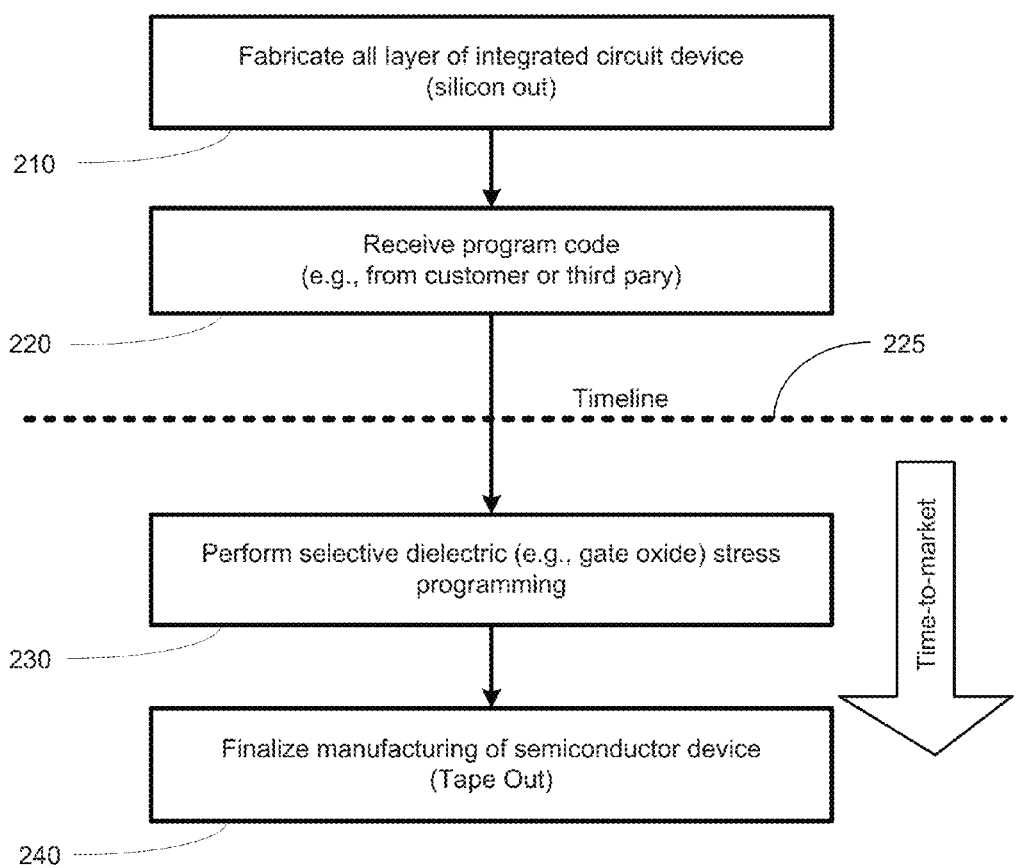
FIG. 2 illustrates a flowchart depiction of the steps for performing a hard-code programming of a semiconductor devices, in accordance with embodiments herein.

Turning now to FIG. 2, a flowchart depiction of performing a hard-code programming of a semiconductor device, in accordance with embodiments herein, is illustrated. A semiconductor device manufacturing system may perform fabrication of a plurality of semiconductor devices (block 210). In some embodiments, semiconductor devices for a plurality of customers that require disparate programming may be fabricated together. Once the semiconductor devices are fabricated, program code for hard-coding or hard-wiring the devices are received (block 220). In some embodiments, external sources, such as customers of the semiconductor devices or third parties may provide the program code. A delay in receiving the program code is less intrusive to the fabrication process since fabrication of the semiconductor devices is substantially complete at this point.

As program code for the semiconductor devices are received, a hard-coding process using selective stress programming may be performed (block 230). The hard-coding or hard-wiring of the program code is performed after the fabrication of the semiconductor devices is complete. A stress voltage process for stressing selective portions of transistors to cause targeted breakdown of dielectric (e.g., gate oxide) regions may be performed. Using addressing of breakdown regions and non-breakdown regions, binary data may be hard-coded, and read by one or portions of an integrated circuit device. In some embodiments, existing testing system for performing stress test may be configured to perform the selective programming using targeted gate oxide breakdown described herein, may be used. For example, a time dependent dielectric breakdown (TDDB) testing system may be used for the hard-coding programming described herein. Upon hard-coding the program, a tape out of a plurality of integrated circuit device (e.g., ASICs) may be provided (block 240). Accordingly, since all fabrication steps to be performed on the semiconductor devices are completed up to the point the process reaches a timeline 225, the only process left to perform is the hard-coding of the program. Therefore, time to market of the finished integrated circuit devices, is only affected by the wait of receiving the program code. Once program code is received and the integrated circuit devices are programmed, there is no further delay in the time to market.

Figure 3:
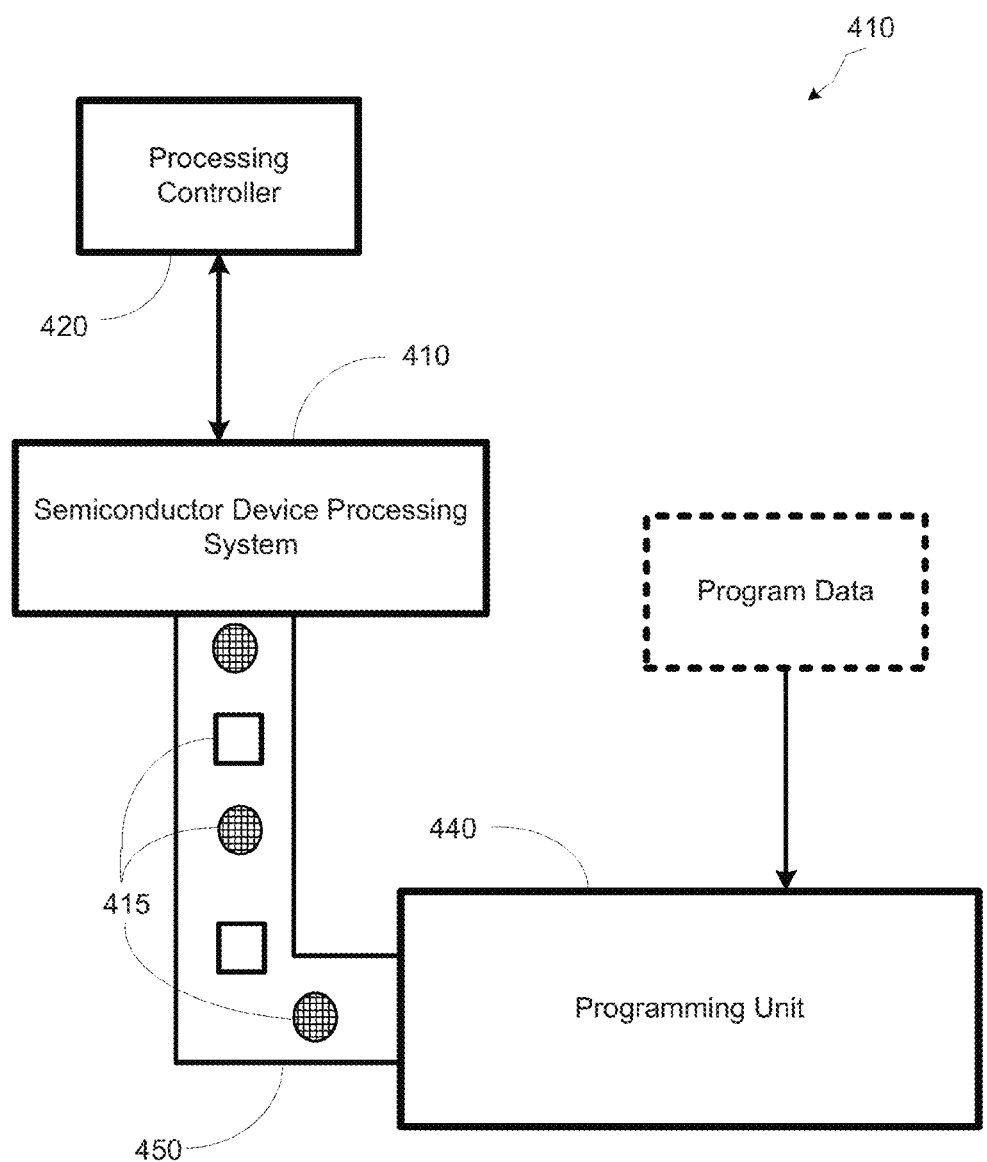
FIG. 3 illustrates a stylized block diagram depiction of a system in accordance with some embodiments herein, is illustrated.

Turning now to FIG. 3, a stylized block diagram depiction of a system in accordance with some embodiments herein, is illustrated. The system 400 may comprise a semiconductor device processing system 410. The semiconductor device processing system 410 may comprise various processing stations, such as etch process stations, photolithography process stations, CMP process stations, etc. One or more of the processing steps performed by the processing system 410 may be controlled by the processing controller 420. The processing controller 420 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 410 may produce integrated circuits on a medium, such as silicon wafers. The processing system 410 may provide processed integrated circuits/devices 415 on a transport mechanism 450, such as a conveyor system. In some embodiments, the conveyor system may be sophisticated clean room transport systems that are capable of transporting semiconductor wafers. In one embodiment, the semiconductor device processing system 410 may comprise a plurality of processing sets, e.g., the 1$^{st}$ process step, the 2$^{nd}$ process set, etc., as described above.

In some embodiments, the items labeled "415" may represent individual wafers, and in other embodiments, the items 415 may represent a group of semiconductor wafers, e.g., a "lot" of semiconductor wafers. The integrated circuit or device 415 may be a transistor, a capacitor, a resistor or a memory cell. In one embodiment, the device 415 is a transistor and the dielectric layer is a gate insulation layer for the transistor.

The system may also comprise a programming unit 440. The programming unit 440 is capable of hard-coding a program code in various semiconductor devices 415. The programming unit 440 is capable of providing stress voltages to targeted portions of the device (e.g., programming layer) in the integrated circuit such that gate oxide breakdown of portions of a discrete device (e.g., a transistor) may be selectively performed for storing binary data that represents a program. The programming unit 440 may perform this stress programming based upon program data that may be received from an external source. In some embodiments the programming unit 440 may be part of a testing system (e.g., a TDDB testing system) that is capable of providing stress data for selective breakdown of gate oxide regions. In alternative embodiments, one or more portions of the programming unit 440 may be fabricated into the semiconductor device 415. A more detailed description of the programming unit 440 is provided in FIG. 4 and accompanying description below.

The system 400 may be capable of performing analysis for various products involving various technologies. For example, the system 400 may provide test data for CMOS technology, Flash technology, BiCMOS technology, power devices, memory devices (e.g., DRAM devices), NAND memory devices, and/or various other semiconductor technologies.

Figure 4:
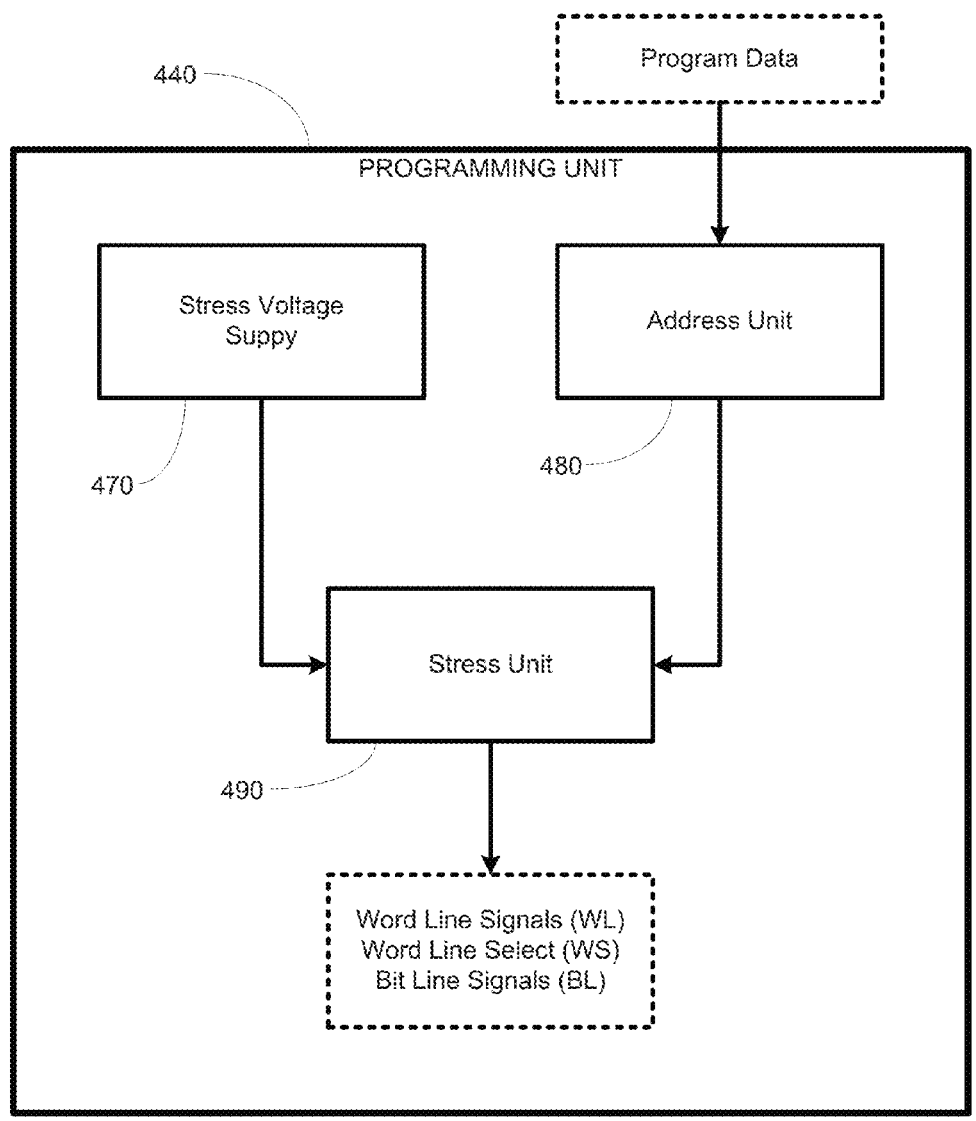
FIG. 4 illustrates a stylized block diagram depiction of the programming unit of FIG. 3, in accordance with embodiments herein.

Turning now to FIG. 4, a stylized block diagram depiction of the programming unit of FIG. 3, in accordance with embodiments herein, is illustrated. The programming unit 440 may comprise a stress voltage supply 470. The stress voltage supply 470 may provide stress voltage signals for performing selective stress breakdown for portions of a transistor. In some embodiments, the stress voltage supply 470 may control the bias voltage signals that are provided to the transistors targeted for selective breakdown.

The programming unit 440 may comprise an address unit 480 that is capable of determining the addresses of portions of the transistors in which a selective breakdown is to be performed. The addresses may include wire-select signals that are able to address a gate, source and/or drain region of a transistor for dielectric breakdown. The address unit 480 may receive program data, which may be used to select transistors in the programming layer of an integrated circuit device for selective breakdown of dielectric, e.g., gate oxide. That is, the gate, source, and/or drain regions of a transistor in the programming layer, may be subjected to a breakdown. Under certain bias conditions (a "read" bias condition), this breakdown may cause the voltage level at the targeted breakdown region to be high, i.e., a logic "1" or logic high. The areas that are not subjected to a dielectric breakdown may indicate a low voltage level under a read bias condition, thereby indicating a logic "0" or logic low. In this manner, transistors in the programming layer may be written using stress breakdown under a "write" bias condition. Data stored in theses transistors may be read under read bias condition, as exemplified below.

The programming unit 440 may also comprise a stress unit 490 that is capable of providing various signals that may be used to target and stress selected portions of transistors for hard-coding a program. The stress unit 490 may receive addressing information from the address unit 480, as well as bias voltage signals from the stress voltage supply 470. Based upon this information, the stress unit 490 is capable of generating various address signals (e.g., word line (WL) signals, word line select (WS) signals, and bit line (BL) signals. These signals may generate a bias write condition to hard-code data into the device, or a bias read condition to read the stored data. In alternative embodiments, one or more portions of the programming unit 440 may be fabricated into the semiconductor device 415. Using the WL, WS, and the BL signals, targeted transistors in the programming layer may be selected to stress breakdown programming, or a read bias condition may be provided for reading the hard-coded data.

Figure 5:
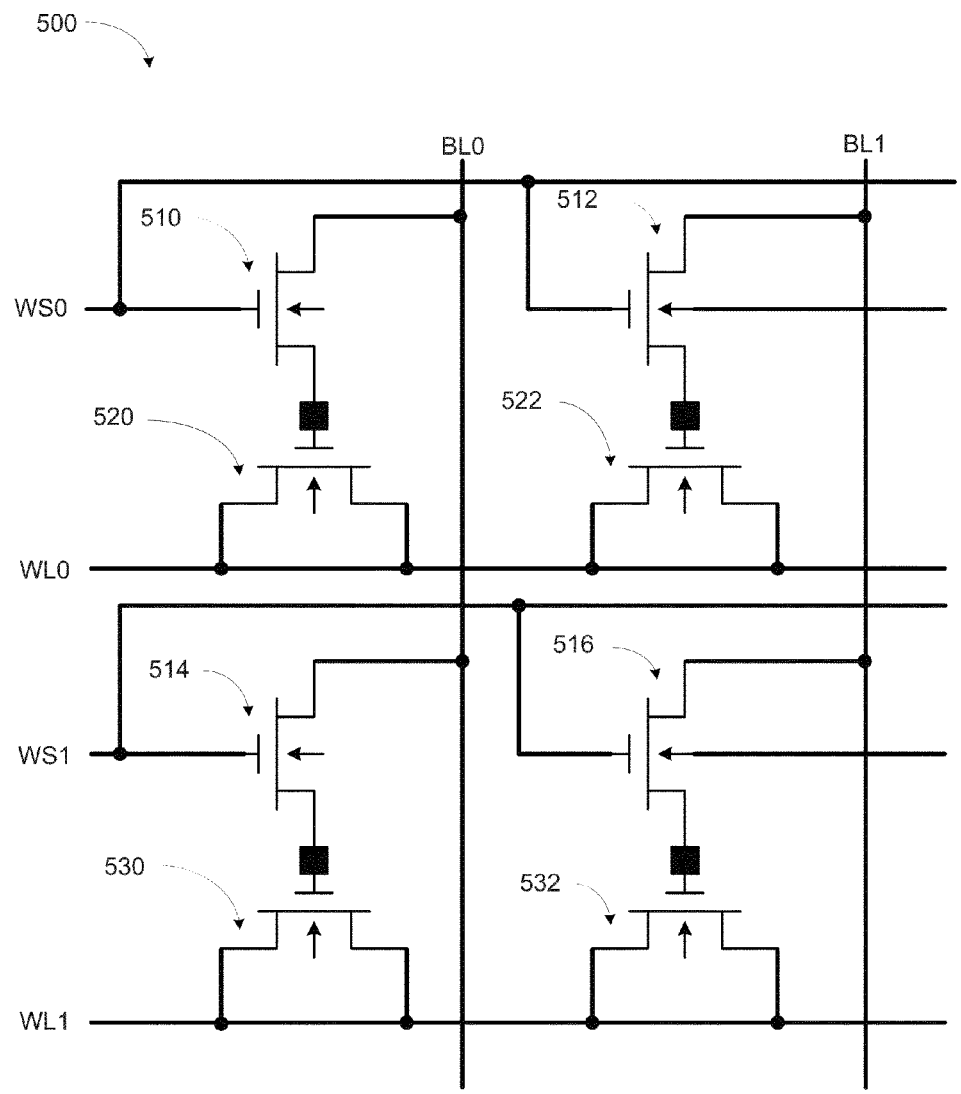
FIG. 5 illustrates a stylized depiction of an ROM architecture in accordance with a first embodiment.

Turning now to FIG. 5, a stylized depiction of an ROM architecture in accordance with a first embodiment, is illustrated. The exemplary circuit 500 of FIG. 5 illustrates a 4-bit memory that can be hard-wired into a programming layer of an integrated circuit in a post-processing step. In one embodiment, the circuit 500 may be a memory cell, and may be part of a larger memory structure.

The circuit 500 of FIG. 5 comprises four thick oxide NFET devices (510, 512, 514, and 516) that are not programmed. Coupled to the source of a thick NFET 510 is the gate of a thin oxide NFET device 520. Coupled to source of a thick NFET 512 is the gate of a thin oxide NFET device 522. Coupled to the source of a thick NFET 514 is the gate of a thin oxide NFET device 530. Coupled to the source of a thick NFET 516 is the gate of a thin oxide NFET device 532. The thin NFETs 520-532 are programmed by providing a stress voltage for prompting selective breakdown of the gate oxides of the NFETs 520-532, wherein the thick NFETs 510-516 are immune to breakdown as a result of the stress voltage. Each pair of thin and thick NFETs are capable of storing one bit of data. Data is stored at the gate oxide location of each of the thin NFETs 520-532, as indicated by black squares.

The operations of the circuit 500 may be controlled by the word line select signals (WS0-1), the word line signals (WL0-1), and the bit line signals (BL0-1). For example, if a logic "1" (i.e., logic high) is to be stored into the gate of NFET 520, WS0 is asserted, BL0 is set at +V$_{DD}$, and WL is set. In this case, the gate oxide experiences a voltage differential of twice the value of V$_{DD}$ (i.e., the differential between at −V$_{DD}$ and +V$_{DD}$) and thus, experiences a breakdown. As another example, if a logic "0" (i.e., logic low) were to be programmed at the NFET 522, the values of BL1, WS0 and WL0 would be set such that a breakdown is not experienced by the gate oxide of NFET 522. Therefore, if data to be stored is logic "0", the gate oxide thin NFET is prevented from experiencing a breakdown, but if data to be stored is logic "1", the breakdown of the gate oxide of the thin NFET is prompted. The signals WS, WL, and BL are capable of generating a write bias condition and/or a read bias condition.

Accordingly, in order to hard-code data (e.g., program data), the write biasing condition include setting the target WS signals to have one V$_{DD}$ at a time, while the remaining WS signals are set at $V_{SS}$. One WL signal corresponding to the selected WS signal is set at $-V_{DD}$ while the rest are all set to $V_{SS}$. The BL line is set to $+V_{DD}$ where a logic "1" is to be stored and set to $-V_{SS}$ where a logic "0" is to be stored.

In order to read data from the circuit 500, the read biasing condition includes setting the target WS signal to $V_{DD}$, while all other WS lines are set to $V_{SS}$. The WL signal corresponding to the selected WS signal is set to $V_{SS}$, while all other WL signals are set to $V_{DD}$. In this case, all BL signals are charged to $V_{DD}$. Using the WS, WL and the BL signals, individual voltage levels of the gate oxides of the thin NFETs 520-532 may be detected and interpreted as logic "1" or logic "0." Those skilled in the art would appreciate that PFET transistors may also be used with opposite values for the WL and BL signals, while remaining within the scope of embodiments herein.

Figure 6:
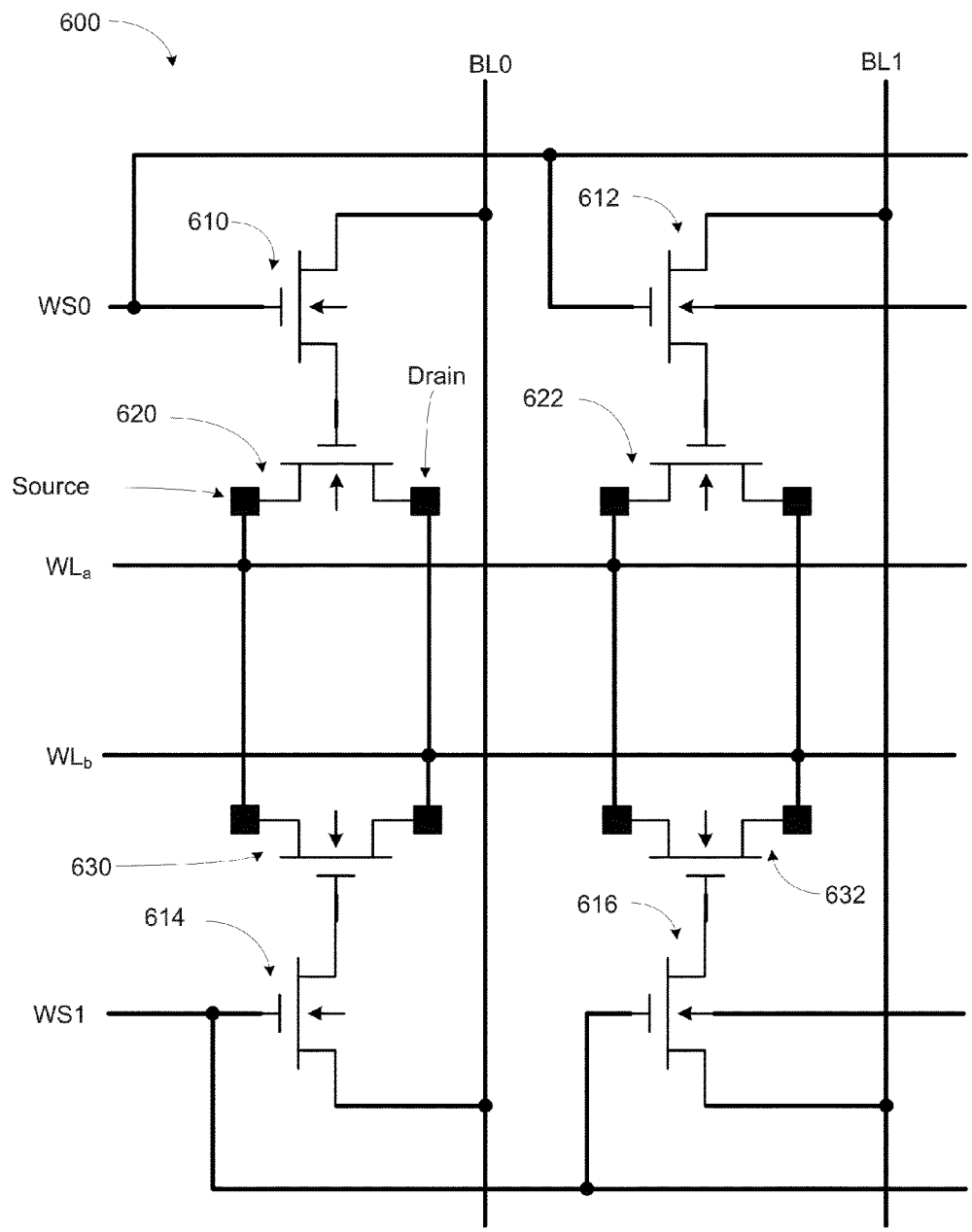
FIG. 6 illustrates a stylized depiction of an ROM architecture in accordance with a second embodiment.

Turning now to FIG. 6, a stylized depiction of an ROM architecture in accordance with a second embodiment, is illustrated. The architecture of FIG. 6 calls for performing local breakdown limited to the drain and/or source regions of transistors using targeted bias voltages. The circuit 600 of FIG. 6 comprises four transistor pairs. Each of the transistor pairs are capable of storing two bits, one in the source region and the other in the drain region of a thin transistor.

The circuit 600 of FIG. 6 comprises four thick oxide NFET devices (610, 612, 614, and 616) that are not programmed and four thin NFET devices (620, 622, 630, 632) that are programmable for hard-coding a program. The thin NFET devices are susceptible to breakdown at a voltage level at which the thick NFET devices are immune to breakdown. In one embodiment, the circuit 600 may be a memory cell, and may be part of a larger memory structure.

The source of the thick NFET 610 is coupled to the thin oxide NFET device 520. The source of the thick NFET 612 is coupled to the gate of the thin oxide NFET device 622. The drain of the thick NFET 614 is coupled to the gate of the thin oxide NFET device 630. The source of the thick NFET 616 is coupled to the gate of the thin oxide NFET device 632. The source and drain nodes of the thin NFETs 620-632 are hard-wire programmed by providing a stress voltage for prompting selective local breakdown of the dielectric (e.g., gate oxide regions) of the source and drain nodes of NFETs 620-632. The thick NFETs 610-616 are immune to breakdown as a result of the stress voltage. Each pair of thin and thick NFETs are capable of storing two bits of data. Data is stored at the source and drain nodes of each of the thin NFETs 660-632, as indicated by black squares.

The signals that control the four pairs of NFET devices in the circuit 600 include the BL0-1 and the WS0-1 signals described above, as well as the two word line signals. The word line signals differ from the signals described above in that there are two word line signals, $WL_a$ and $WL_b$ in the circuit 600. The word line signal $WL_a$ is coupled to the source nodes of the NFET 620 and the NFET 622. The word line signal $WL_b$ is coupled to the drain nodes of the NFETs 630 and 632.

In order to hard-code data (e.g., program data), a write bias condition is prompted by setting the target WS signals to have one $V_{DD}$ at a time while the remaining WS signals are set at $V_{SS}$. The BL line is set to $+V_{DD}$ where a logic "1" is to be stored, and set to $-V_{SS}$ where a logic "0" is to be stored. The word line signal $WL_a$ is set to $-V_{DD}$ for storing a logic "1" into a source node, and is set to $V_{SS}$ for storing a logic "0" in a source node. The word line signal $WL_b$ is set to $-V_{DD}$ for storing a logic "1" in a drain node, and is set to $V_{SS}$ for storing a logic "0" in a drain node.

In order to read data from a source node circuit 600, a read biasing condition includes setting the target WS signal to $V_{DD}$, while all other WS lines are set to $V_{SS}$. If data from the source nodes are being read, the $WL_a$ signal is set at $V_{SS}$, while the $WL_b$ signal is set at $V_{DD}$. If data from the drain nodes are being read, the $WL_b$ signal is set at $V_{SS}$, while the $WL_a$ signal is set at $V_{DD}$. In the read mode, all BL signals are pre-charged to $V_{DD}$.

As an example of selective breakdown for hard-coding data, if a logic "1" is to be programmed into the drain node of NFET 620, BL1 is set to $V_{DD}$, BL1 is set to zero, WS0 is set to $V_{DD}$, $WL_a$ is set to zero, $WL_b$ is set to $-V_{DD}$, and WS1 is set to zero. In this configuration, the drain location of NFET 620 will experience a stress voltage of two times $V_{DD}$, which would be sufficient to cause a gate dielectric breakdown of the drain location.

During hard-coding of data into the NFET devices, drain and source electrical connections should be avoided in order to reduce the probability of uncertain breakdown between gate and drain or between gate and source. In some embodiments, in order to prevent the MOS action between the drain and source of an NFET device, one or more channel implants may be added. In one embodiment, an extra masking step may be used to add the channel implants.

An example of reading data from the circuit 600, if the drain node of 620 of NFET 620 is to be read, BL1 and BL2 will be set to $V_{DD}$, WS0 is set to $V_{DD}$, $WL_a$ is set to $V_{DD}$, $WL_b$ is set to zero, and WS1 is set to zero. In this case, there is a discharge from the path from BL1 to $WL_b$. In this case, the voltage of the source region of NFET 620 will be interpreted as a logic "1."

As another example of reading data from the circuit 600, if the drain node of NFET 630 is to be read, BL1 and BL2 will be set to $V_{DD}$, WS0 is set to zero, $WL_a$ is set to zero, $WL_b$ is set to $V_{DD}$, and WS1 is set to $V_{DD}$. In this case, there is a lack of discharge in the path between BL1 and $WL_a$ because this drain region was not stressed during the programming phase. In this case, the voltage of the drain region of NFET 630 will be interpreted as a logic "0."

Using the WS, $WL_a$, $WL_b$, and the BL signals, individual voltage levels of the source and drain regions of the thin NFETs 620-632 may be detected and interpreted as either logic "1" or logic "0."

Figure 7:
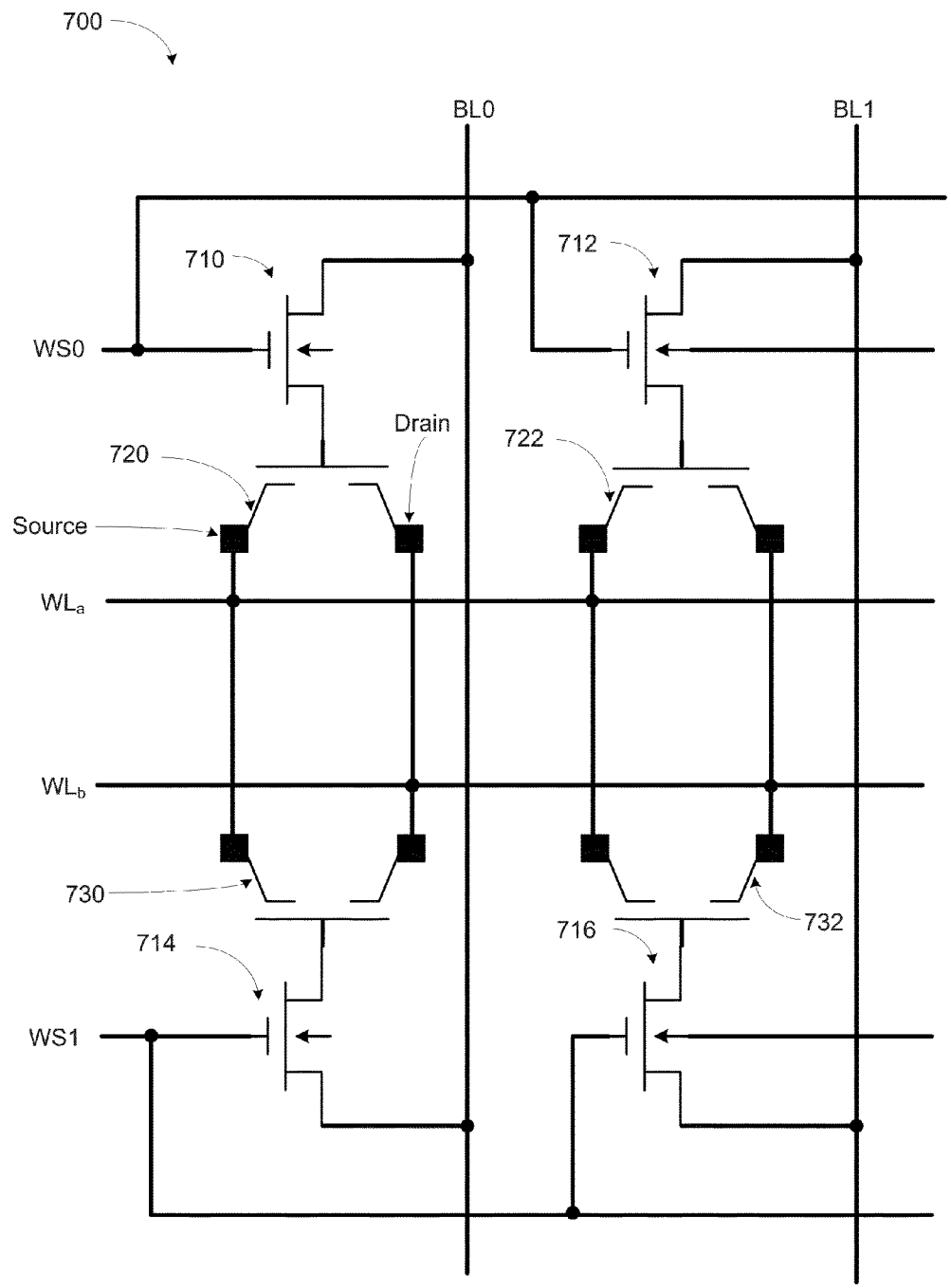
FIG. 7 illustrates a stylized depiction of an ROM architecture in accordance with a third embodiment.

Turning now to FIG. 7, a stylized depiction of an ROM architecture in accordance with a third embodiment, is illustrated. The architecture of FIG. 7 calls for performing local breakdown limited to the drain and/or source regions of transistors using targeted write bias voltage conditions. This process may be performed in a similar manner as described above with respect to FIG. 6. The circuit 700 of FIG. 7 comprises four transistor pairs. Each of the transistor pairs are capable of storing two bits, one in the source region and the other in the drain region of a thin transistor. In one embodiment, the 700 may be a memory cell, and may be part of a larger memory structure.

The circuit 700 of FIG. 7 comprises four thick oxide NFET devices (710, 712, 714, and 716) that are not programmed. With regard to the programmable FETs, the embodiment of FIG. 7 utilizes two separate gate capacitors for each equivalent programmable FET, a gate-to-source capacitor (i.e., source region) and a gate-to-drain capacitor (i.e., drain region) to providing the equivalent FETs (720-732). The source and drain regions of the gate capacitor devices (720-732) are susceptible to breakdown at a voltage level at which the thick NFET devices are immune to breakdown.

The configuration of FIG. 7 can be programmed and read in similar fashion as described above with regard to FIG. 6. The configuration of FIG. 7 may provide for a reduction in uncertain breakdown between gate-to-drain, or between gate-to-source. Further stray currents between the drain regions and $WL_a$, as well as between the source regions and $WL_b$, may be reduced using the configuration of FIG. 7. Moreover, the configuration of FIG. 7 may also provide for a reduction in noise.

Figure 8:
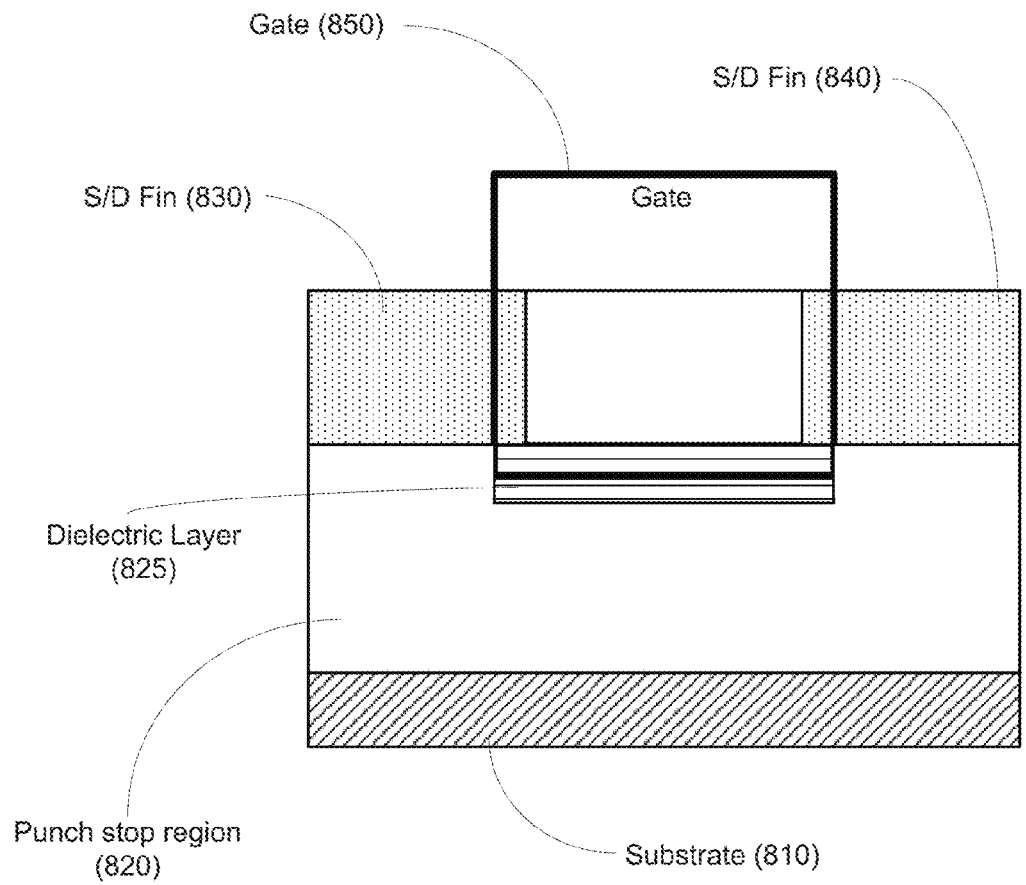
FIG. 8 illustrates a stylized depiction of a cross-sections view of a FinFET that may be implemented into the ROM architecture of FIG. 7, in accordance with embodiments herein.

Turning now to FIG. 8, a stylized depiction of a cross-sections view of a FinFET that may be implemented into the ROM architecture of FIG. 7, in accordance with embodiments herein, is illustrated. Referring simultaneously to FIGS. 7 and 8, a FinFET device may be used in place of the gate capacitors for providing the source and drain regions that may be programmed using the targeted breakdown process described above.

In a FinFET device, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a frigate structure. Since the channel is extremely thin, the gate would generally have a greater control over the carriers within. However, when the transistor is switched on, the shape of the channel may limit the current flow.

In one embodiment, two separate gate-to-drain and gate-to-source capacitors may be formed by utilizing a fin-cut masking step. The fin-cut masking step may be used to separate the fin channel. A fin of the FinFET may be cut in such a way that two separate gate capacitors (gate-to-drain and gate-to-source capacitors) are formed. FIG. 8 illustrates a punch stop region 820 above a substrate 810. A dielectric layer 825 may be formed over the punch stop region 820. The cross-sectional diagram illustrates two fins 830, 840 coupled to the gate region 850. The fins 830, 840 of the FinFETs may be cut in such a manner that source and drain region pairs (720-732) are formed (FIG. 7). In one embodiment, using this architecture with respect to bulk-FinFET, the drain and source regions are substantially isolated by junctions. In another embodiment, using this architecture with respect to SOI-FinFET, the drain and source regions are substantially isolated by an oxide region.

In some embodiments, each of the circuits of FIGS. 5-7 may represent a memory cell or a portion of a memory cell. In some embodiments, each of the circuits of FIGS. 5-8 maybe a hard-wire memory cell that is part of a larger array of memory cells in which data may be hard-coded or hard-wired. One or more portions of an integrated circuit device may be able to address and read the hard-wired stored data. In some embodiments, the stored data may comprise a program code that may be executed (e.g., boot-up execution sequence) by another portion (e.g., a processor, a controller, a micro-controller, etc.) of the integrated circuit device.

Although various circuits described herein were described in terms of NFETs for consistency, those skilled in the art would appreciate that PFET transistors may also be used, while remaining within the scope of embodiments herein.

The system 400 may be capable of manufacturing and testing various products that include transistors with active and inactive gates involving various technologies. For example, the system 900 may provide for manufacturing and testing products relating to CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein (e.g., FIG. 2) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for hard-coding data into an integrated circuit device, comprising:
   providing an integrated circuit device comprising a first plurality of thick oxide transistors, a second plurality of thin oxide transistors, a first word line, and a second word line, wherein a gate of each thin oxide transistor is coupled to a source or a drain of one thick oxide transistor, the first word line is coupled to a source of each thin oxide transistor, the second word line is coupled to a drain of each thin oxide transistor, the thin oxide transistors are susceptible to breakdown at a first voltage level, and the thick oxide transistors are immune to breakdown at the first voltage level;
   receiving data for hard-wiring said data into a portion of said integrated circuit device; and
   providing a stress voltage signal having the first voltage level to at least one of a source or a drain of at least one thin oxide transistor of said integrated circuit device for causing a dielectric breakdown of said at least one of said source or said drain of said at least one thin oxide transistor for hard-wiring said data.

2. The method of claim 1, wherein providing said integrated circuit device comprises fabricating said integrated circuit, wherein fabricating comprises fabricating a programming layer comprising a plurality of said thin oxide transistors susceptible to said breakdown of a targeted portion of said thin oxide transistors.

3. The method of claim 1, wherein receiving data for hard-wiring comprises receiving a program code for hard-coding said program code into said integrated circuit device.

4. The method of claim 1, wherein providing a stress voltage signal to a portion a transistor of said integrated circuit device for causing a dielectric breakdown of said portion comprises providing an address for targeting a portion of said transistor for dielectric breakdown.

5. The method of claim 4, wherein providing a stress voltage signal to a portion of a transistor of said integrated circuit device for causing a dielectric breakdown of said portion comprises providing a bias condition such that said portion of said transistor targeted by said address is caused to have a dielectric breakdown.

6. The method of claim 5, wherein providing said bias condition comprises providing a bias condition such that a least one of a source region and a drain region of the gate oxide of said transistor is targeted by said address is caused to have a dielectric breakdown.

7. The method of claim 5, wherein providing said bias condition comprises providing arranging a plurality of transistors such that at least one of a gate, source, or drain of at least one of said plurality of transistors is provided with a differential voltage of plus VDD and minus VDD, wherein said address targets at least one of said gate, source, or drain for dielectric breakdown based upon said differential voltage.

8. The method of claim 1, wherein said at least one of said source or said drain targeted for dielectric breakdown stores at least one of a logic high value as a result of said dielectric breakdown, or a logic low value as a result of not experiencing a dielectric breakdown.

9. The method of claim 8, further comprising reading at least one of said logic high value or said logic low value.

10. The method of claim 1, wherein the integrated circuit device comprises four thick oxide transistors and four thin oxide transistors.

11. The method of claim 1, wherein the source of at least one thin oxide transistor is a gate-to-source capacitor.

12. The method of claim 1, wherein the drain of at least one thin oxide transistor is a gate-to-drain capacitor.

\* \* \* \* \*